(12) United States Patent
Audinot et al.

(10) Patent No.: US 7,565,125 B2
(45) Date of Patent: Jul. 21, 2009

(54) TELECOMMUNICATIONS RECEIVER WITH AUTOMATIC GAIN CONTROL

(75) Inventors: Pascal Audinot, Valbonne (FR); Vincent Roussel, Cagnes-sur-Mer (FR)

(73) Assignee: Texas Instruments Incorporated, Dallas, TX (US)

( * ) Notice: Subject to any disclaimer, the term of this patent is extended or adjusted under 35 U.S.C. 154(b) by 157 days.

(21) Appl. No.: 10/601,348

(22) Filed: Jun. 23, 2003

(65) Prior Publication Data

US 2004/0259510 A1 Dec. 23, 2004

(30) Foreign Application Priority Data

Dec. 18, 2002 (EP) ................... 02293151

(51) Int. Cl.
*H04B 1/06* (2006.01)
*H04B 7/00* (2006.01)

(52) U.S. Cl. .................. 455/234.2; 455/136; 375/345; 375/350

(58) Field of Classification Search .............. 455/232.1, 455/234.1, 245.1, 227–229, 234.2; 375/345, 375/346, 350
See application file for complete search history.

(56) References Cited

U.S. PATENT DOCUMENTS

| | | | | |
|---|---|---|---|---|
| 3,931,584 A * | 1/1976 | Motley et al. ............... 330/129 |
| 5,828,328 A * | 10/1998 | Marks .......................... 341/139 |
| 6,121,828 A * | 9/2000 | Sasaki .......................... 329/304 |
| 6,295,445 B1 * | 9/2001 | Uesugi ..................... 455/234.1 |
| 6,314,278 B1 * | 11/2001 | Zamat ...................... 455/239.1 |
| 6,510,188 B1 * | 1/2003 | Isaksen et al. ............... 375/345 |
| 6,606,359 B1 * | 8/2003 | Nag et al. .................... 375/348 |
| 6,831,957 B2 * | 12/2004 | Chen ........................... 375/345 |
| 7,103,116 B2 * | 9/2006 | Thompson et al. ........... 375/340 |
| 7,415,083 B2 * | 8/2008 | Anderson .................... 375/345 |
| 2003/0059065 A1 * | 3/2003 | Wildhagen et al. .......... 381/107 |
| 2004/0072547 A1 * | 4/2004 | Axness et al. ............... 455/130 |
| 2004/0259510 A1 * | 12/2004 | Audinot et al. .............. 455/136 |

OTHER PUBLICATIONS

"Self-Tuned RC-Active Filters for VLSI", J. B. Hughes, et al., Electronic Letters, vol. 22, No. 19, Sep. 11, 1986, pp. 411-412.

* cited by examiner

*Primary Examiner*—Edward Urban
*Assistant Examiner*—Christian A Hannon
(74) *Attorney, Agent, or Firm*—Wade J. Brady, III; Frederick J. Telecky, Jr.

(57) ABSTRACT

A receiver 30 has an adjustable gain control circuit 32 that provides gain control base on the magnitude of the signal at the input of an analog-to-digital converter 22. The magnitude of a gain increase or decrease can be based on the most significant bits of the analog-to-digital output, indicating whether the analog-to-digital converter is close to saturation, approaching saturation, or well below saturation.

24 Claims, 2 Drawing Sheets

TELECOMMUNICATIONS RECEIVER WITH AUTOMATIC GAIN CONTROL

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to telecommunications and, more particularly, to a telecommunications receiver with automatic gain control.

2. Description of the Related Art

In a radio frequency receiver, an automatic gain control circuit is often used to compensate for variations in signal strength of the received signal. Variations in the signal strength of the received signal can occur for various reasons, such as changes in transmission distances, atmospheric conditions, changes in channels, obstructions in the transmission path, and so on.

Accordingly, automatic gain control circuits are used to maintain a relatively stable output signal volume, despite varying input signal strength. Current solutions base gain adjustment decisions on a signal level measurement performed in a digital signal processor (DSP) after digital channel filtering has been applied to the input signal. As a result, saturation may occur in the analog-to-digital converter (ADC) which translates the input signal (where the signal may be the superposition of the useful signal, DC offset, adjacent channels and blockers) to a digital signal for processing by the DSP. When saturation occurs, signal information is irretrievably lost.

Therefore, a need has arisen for a radio receiver with automatic gain control that avoids ADC saturation.

BRIEF SUMMARY OF THE INVENTION

In the present invention, a receiver comprises analog-to-digital circuitry for generating a digital representation of a signal at an input and adjustable gain control circuitry for receiving a radio signal and outputting an amplified analog signal using a gain determined by a magnitude of the signal at the output of the analog-to-digital circuitry. Digital channel filtering circuitry filters the digital representation and digital processing circuitry processes the output of the digital representation.

The present invention provides significant advantages over the prior art. By initiating gain changes in the automatic gain control circuit responsive to the signal at the output of the analog-to-digital circuit (where the signal may be the superposition of the useful signal, DC offset, adjacent channels and blockers), the gain control implementation permits optimal use of the analog-to-digital converter's dynamic range. The present invention allows reductions in gain only when necessary, with subsequent optimization of receiver sensitivity.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
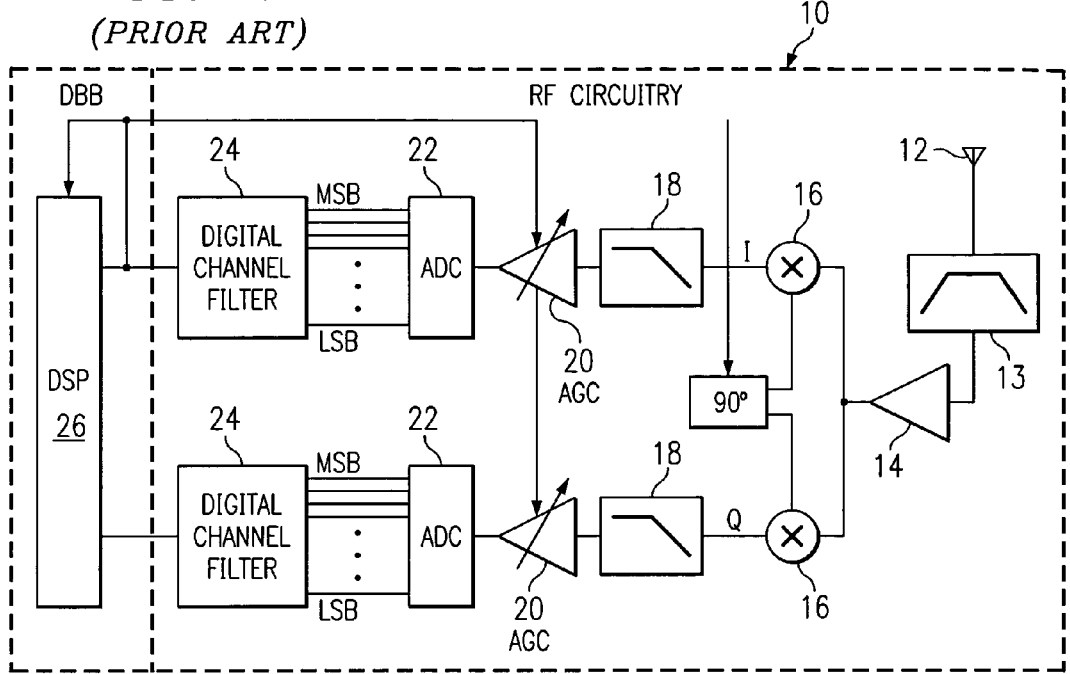
FIG. 1 illustrates a basic block diagram of a prior art digital radio receiver.
Figure 2:
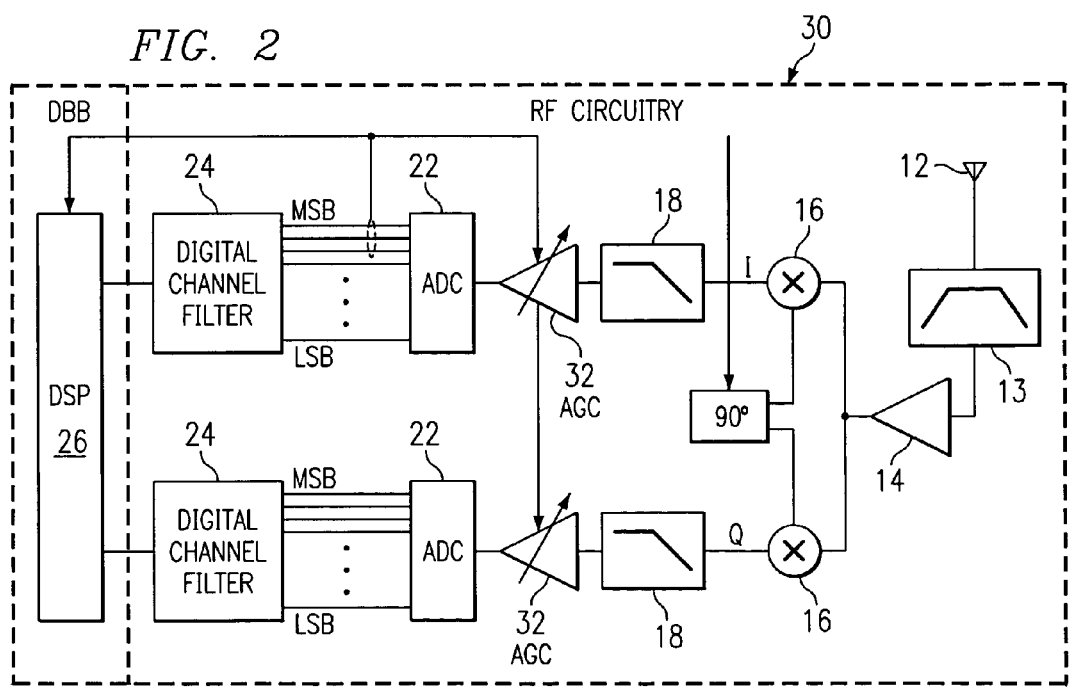
FIG. 2 illustrates a block diagram of a receiver with gain variations based on the magnitude of the signal converted by an analog-to-digital converter.
Figure 3:
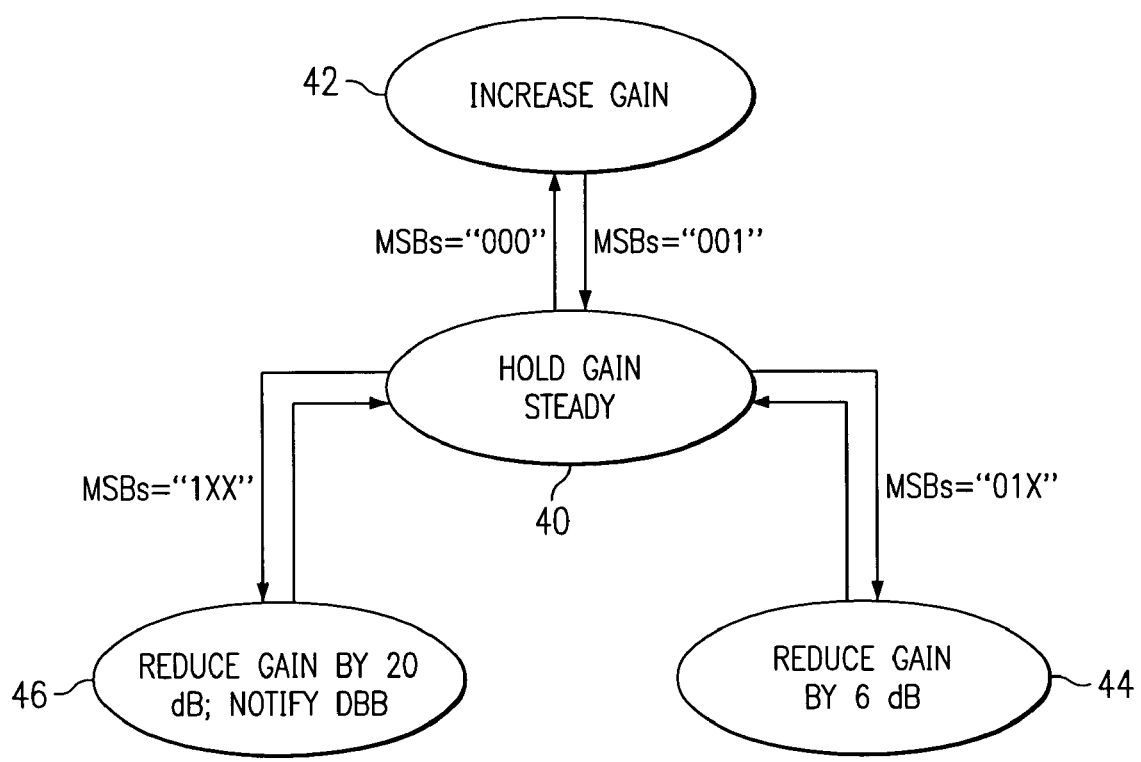
FIG. 3 illustrates a state diagram showing an example of how the most significant bits of the output of the analog-to-digital converter can be used for gain control.

The present invention is best understood in relation to FIGS. 1-3 of the drawings, like numerals being used for like elements of the various drawings.

FIG. 1 illustrates a basic block diagram of a prior art digital radio receiver 10. An input signal is received on antenna 12, passed through bandpass filter 13, and amplified by amplifier 14. The amplified input signal is separated into I and Q components through mixers 16, which are coupled to carrier frequency signals, offset by 90 degrees. Both I and Q signals are subjected to respective low pass filters 18. The outputs of low pass filters 18 are input to automatic gain control (AGC) circuits 20, which are set to the same gain. The output of the AGC circuits 20 are input to ADC circuits 22, which convert the signal to a binary representation. The outputs of the ADC's are coupled to digital channel filters 24. The output of the digital channel filters are coupled to a processor 26, shown in FIG. 1 as a digital signal processor (DSP).

In operation, the output of one of the digital channel filters 24 is sampled by the DSP 26. If the signal level at the output of one of the digital channel filter 24 is too high, the AGC 20 is adjusted by the DSP 26 to reduce the level of the signal input to the ADC to avoid saturation. The AGC gain is set to maintain a useful signal-to-noise ratio, referencing the useful signal to the noise floor.

The circuit of FIG. 1 may produce incorrect results in certain situations, because it measures the filtered signal being input to the DSP. Using GPRS (General Packet Radio Service), for example, either sensitivity or interference tests may be used to set the automatic gain control. A sensitivity test determines whether a mobile device can successfully receive a signal at a very low level at the antenna 12. In this test, the receiving device is set to maximum gain in order to minimize the receiver noise figure (i.e., to achieve the maximum signal-to-noise level at the input of the ADC 20). In the sensitivity test, since the received signal is very low, there is no chance of ADC saturation.

In an interference test, however, an interferer is added to the useful signal at the antenna. The useful signal is applied at the antenna at a level 20 dB above the sensitivity level. The interferer is applied at a high level; for instance, the interferer may be 41 dB above the useful signal in $2^{nd}$ adjacent interference. When the receiver is at maximum gain, the interfering signal can make the ADC clip.

As noted above, in GPRS, either a sensitivity test or an interference test may be used in the automatic gain strategy. The receiving device will not know which test is being used. Therefore, the receiver will set the gain to its maximum gain. Since the digital channel filter 24 will filter out the interfering signal, the signal applied to the DSP may remain within an acceptable range, although the signal at the input of the ADC 22 may cause the ADC 22 to be at saturation or close to saturation. Accordingly, the gain will be set too high, resulting in a distorted signal.

FIG. 2 illustrates a block diagram of a receiver 30 which alleviates the problem set forth above. As in FIG. 1, an input signal is received on antenna 12, passed through bandpass filter 13, and amplified by amplifier 14. The amplified input signal is separated into I and Q components through mixers 16, which are coupled to carrier frequency signals, offset by 90 degrees. Both I and Q signals are subjected to respective low pass filters 18. The outputs of low pass filters 18 are input to automatic gain control (AGC) circuits 32, which are set to the same gain. The output of the AGC circuits 32 are input to ADC circuits 22, which convert the signal to a binary representation. The outputs of the ADCs are coupled to respective digital channel filters 24. The output of the digital channel filters are coupled to processor 26. The output of at least one ADC 22 is also coupled to an AGC 32.

In operation, the AGCs 32 adjust gain responsive to the magnitude of the signal output from one of the ADCs 22, prior to filtering by the digital channel filter 24. The magnitude of the input signal to the ADC 22 may be determined using a set of most significant bits of the ADC output. Depending upon the urgency of the gain adjustment (i.e., depending upon how close the ADC is to saturation), the gain adjustment may be made directly by the AGC 32 without DSP intervention. For example, the gain may be reduced automatically by the AGC 32 whenever the most significant bit of the ADC output is set to "1" and may be reduced or increased responsive to control signal from the DSP in other circumstances.

The output of the ADC 22 is thus used to determine the correct gain, rather than using the output of the digital channel filter 24 to determine the correct gain. If the output of ADC exceeds a certain level, the gain can be adjusted downward to avoid clipping of the signal. Thus, if a sensitivity test is used, the low-power useful signal will not cause clipping and the gain can be set to its maximum. On the other hand, if an interference test is used, if the power of the two signals exceeds a certain level, the gain can be reduced, while maintaining an adequate margin between quantification noise and useful signal at the ADC input, thus allowing more room for the interfering signal in the dynamic range of the ADC 22.

In the preferred embodiment, the gain adjustment is controlled by using a predetermined number of the MSBs (most significant bits) of the output of one of the ADCs 22.

FIG. 3 illustrates a state diagram showing an example of how the MSBs of the output of the ADC 22 can be used for gain control. This example uses the three most significant output bits of one of the ADCs 22; however, more or less of the MSBs could be used in an actual implementation. Using more MSBs could provide greater resolution in the gain control, although with slightly more complexity.

In state 40, the gain is held steady. While the three MSBs="000", the gain is increased in state 42, potentially all the way to maximum gain (as would occur during the sensitivity test). Once the MSBs="001" the gain is held steady in state 40.

If MSBs="01x" (where "x" indicates a don't care), the digital baseband (i.e., the DSP 26) reduces the gain of the AGC by 6 dB. The gain would be repeatedly reduced by 6 dB until the MSBs return to "00x".

If the MSBs="1xx", then the gain is reduced by 20 dB, in order to avoid an immediate saturation problem at the ADC 22. In the preferred embodiment, the emergency gain reduction is performed without DBB interaction; the DBB is informed by the AGC that the gain has been reduced. In the interfering channel test condition, the gain can be reduced by 20 dB without any performance degradation.

In order to prevent hysteresis (oscillations between increasing gain and decreasing gain), the decision threshold between gain increase and gain decrease should be different.

While FIG. 3 illustrates an embodiment for controlling gain, the thresholds for initiating a gain switch, and the magnitude of a given change, could be varied as desired.

The present invention provides significant advantages over the prior art. By initiating gain changes in the AGC responsive to the signal at the output of the ADC (where the signal may be the superposition of the useful signal, DC offset, adjacent channels and blockers) the AGC implementation permits optimal use of the ADC's dynamic range. The degree of gain change may also be varied depending upon the magnitude of the signal at the output of the ADC. Gain control is thus compatible with GPRS test modes. If the ADC is integrated in the RF chip, the detection is free, since the ADC can be used as the detector with the MSB bits of the output digital word indicating how far the ADC is from saturation.

While a reduction in the receiver gain increases the noise floor, the present invention reduces gain only when necessary, with subsequent optimization of receiver sensitivity. Whereas saturation completely removes information from the signal, a reduction of the signal-to-noise ratio will allow demodulation, with some BER (bit error rate) degradation.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

The invention claimed is:

1. A receiver comprising:
   analog-to-digital circuitry for generating a digital representation, comprising a bit signal, of an amplified analog signal at an input;
   adjustable gain control circuitry for receiving a radio signal and outputting the amplified analog signal using a gain determined by a magnitude of the amplified analog signal, the gain being connected directly to the bit signal at an output of the analog-to-digital circuitry;
   digital channel filtering circuitry for filtering said digital representation; and
   digital processing circuitry for processing the output of said digital channel filtering circuitry,
   wherein the gain is adjusted by a first amount responsive to a first bit selected from a predetermined plurality of most significant bits in the bit signal, the first bit indicating that the output of the analog-to-digital circuitry has exceeded a first saturation threshold,
   wherein the gain is adjusted by a second amount responsive to a first set of bits selected from the predetermined plurality of most significant bits in the bit signal, the first set of bits indicating that the output of the analog-to-digital circuitry has exceeded a second saturation threshold,
   wherein the first amount is not equal to the second amount, and
   wherein the first saturation threshold is not equal to the second saturation threshold.

2. The receiver of claim 1 wherein said adjustable gain control circuitry adjusts said gain independent of said digital processing circuitry.

3. The receiver of claim 1 wherein said gain is adjusted by a third amount responsive to a second set of bits selected from the predetermined plurality of most significant bits of said bit signal, the second set of bits indicating that the output of the analog-to-digital circuitry is below a third saturation threshold.

4. The receiver of claim 3 wherein the third amount represents an increase in the gain.

5. The receiver of claim 1 wherein the first bit is the most significant bit of the predetermined plurality of most significant bits, the first bit indicating that the output of the analog-to-digital converter has exceeded the first saturation threshold, and wherein the first bit signal is directly connected to a gain control input of the adjustable gain control circuitry.

6. The receiver of claim 1 wherein said gain is adjusted by the first amount using the output of the analog-to-digital circuitry without intervention from the digital processing circuitry if the output of the analog-to-digital circuitry is close to saturation over the first saturation threshold.

7. The receiver of claim 1 wherein both the first and the second amounts represent a decrease in the gain.

8. A method of receiving a signal in a receiver, comprising the steps of:
   generating a digital representation of a signal at an output of an analog-to-digital converter after applying a gain to the signal;
   adjusting the gain by a magnitude of the signal, the gain being directly connected and responsive to bit values of the digital representation of said output of said analog-to-digital converter;
   generating a filtered digital representation for a desired channel; and
   processing the filtered digital representation,
   wherein adjusting the gain comprises
   adjusting the gain by a first predetermined amount responsive to a first bit selected from a predetermined plurality of most significant bits from the bit values of the digital representation, the first bit indicating that the output of the analog-to-digital converter has exceeded a first saturation threshold, and
   adjusting the gain by a second predetermined amount responsive to a first set of bits selected from the predetermined plurality of most significant bits from the bit values of the digital representation, the first set of bits indicating that the output of the analog-to-digital converter has exceeded a second saturation threshold,
   wherein the first predetermined amount and the second predetermined amount are not equal, and
   wherein the first saturation threshold is not equal to the second saturation threshold.

9. The method of claim 8 wherein said adjusting the gain by the first predetermined amount is performed using the output of the analog-to-digital converter without intervention from a digital processor if the output of the analog-to-digital converter is close to saturation over the first saturation threshold.

10. The method of claim 8 wherein both the first and second predetermined amounts represent a decrease in the gain.

11. The method of claim 8 wherein adjusting the gain further comprises adjusting the gain by a third amount responsive to a second set of bits selected from the predetermined plurality of most significant bits from said bit values of the digital representation, the second set of bits indicating that the output of the analog-to-digital converter has fallen below a third saturation threshold.

12. The method of claim 11 wherein the third amount represents an increase in the gain.

13. A receiver comprising:
    adjustable gain control circuitry for receiving a radio signal and outputting an amplified analog signal using a gain determined by a magnitude of the amplified analog signal. the gain being connected directly to a single bit sample of a digital representation signal at an output of an analog-to-digital circuitry;
    digital channel filtering circuitry for filtering said digital representation; and
    digital processing circuitry for processing the output of said digital channel filtering circuitry,
    wherein the gain is operable to be adjusted by a first amount responsive to a first bit selected from a predetermined plurality of most significant bits in the single bit sample of the digital representation signal, the first hit indicating that the output of the analog-to-digital circuitry has exceeded a first saturation threshold,
    wherein the gain is operable to be adjusted by a second amount, responsive to a first set of bits selected from the predetermined plurality of most significant bits in the single bit sample of the digital representation signal, the first set of bits indicating that the output of the analog-to-digital circuitry has exceeded a second saturation threshold,
    wherein the first amount and the second amount are not equal, and
    wherein the first saturation threshold is not equal to the second saturation threshold.

14. The receiver of claim 13 wherein said adjustable gain control circuitry is coupled to receive an output signal from at least one low pass filter.

15. The receiver of claim 14 wherein at least one input of said at least one low pass filter is coupled to an output of at least one mixer.

16. The receiver of claim 15 wherein at least one input of said at least one mixer is coupled to an output of an amplifier.

17. The receiver of claim 16 wherein an input of said amplifier is coupled to an output of a bandpass filter.

18. receiver of claim 14 wherein said at least one low pass fitter comprises two low pass filters.

19. The receiver of claim 13 wherein said adjustable gain control circuitry comprises two gain control circuits, whereby both sensitivity and interference tests may be conducted.

20. The receiver of claim 13 wherein at least one bit from the predetermined plurality of most significant bits in the single bit sample of said digital representation at said output of the analog-to-digital circuitry is directly connected to an input of said adjustable gain control circuitry.

21. The receiver of claim 13 wherein said analog-to-digital circuitry comprises two analog-to-digital circuits, one of said analog-to-digital circuits having an output directly connected to an input of said adjustable gain control circuitry, whereby both sensitivity and interference tests may be conducted, wherein the gain is connected directly to the digital representation signal at an output of only one of the two analog-to-digital circuits.

22. The receiver of claim 13 wherein said gain is operable to be adjusted by the first amount using the output of the analog-to-digital circuitry without intervention from the digital processing circuitry if the output of the analog-to-digital circuitry is close to saturation over the first saturation threshold.

23. The receiver of claim 13 wherein the both first and second amounts represent a decrease in the gain.

24. The receiver of claim 13 wherein the gain is operable to be adjusted by a third amount responsive to a second set of bits selected from the predetermined plurality of most significant bits in the single bit sample of the digital representation signal, the second set of bits indicating that the output of the analog-to-digital circuitry has fallen below a third saturation threshold.

* * * * *